(12) United States Patent
Feldman

(10) Patent No.: US 8,868,021 B1
(45) Date of Patent: Oct. 21, 2014

(54) ULTRA-BROADBAND PLANAR MILLIMETER-WAVE MIXER WITH MULTI-OCTAVE IF BANDWIDTH

(71) Applicant: National Instruments Corporation, Austin, TX (US)

(72) Inventor: Alexander Feldman, San Jose, CA (US)

(73) Assignee: National Instruments Corporation, Austin, TX (US)

( * ) Notice: Subject to any disclaimer, the term of this patent is extended or adjusted under 35 U.S.C. 154(b) by 23 days.

(21) Appl. No.: 13/857,481

(22) Filed: Apr. 5, 2013

(51) Int. Cl.
- *H04B 1/26* (2006.01)
- *H04B 1/04* (2006.01)
- *H01P 5/10* (2006.01)
- *H04B 1/18* (2006.01)

(52) U.S. Cl.
CPC .............. *H01P 5/1015* (2013.01); *H04B 1/18* (2013.01)
USPC .......................................... 455/323; 455/118

(58) Field of Classification Search
USPC ................. 455/110, 118, 313, 323; 327/113
See application file for complete search history.

(56) References Cited

U.S. PATENT DOCUMENTS

| | | | |
|---|---|---|---|
| 3,755,759 A | 8/1973 | Cohn | |
| 4,563,773 A * | 1/1986 | Dixon et al. | 455/327 |
| 4,610,032 A * | 9/1986 | Miller et al. | 455/325 |
| 4,739,519 A | 4/1988 | Findley | |
| 4,755,775 A | 7/1988 | Marczewski et al. | |
| 5,125,111 A | 6/1992 | Trinh | |
| 5,396,658 A * | 3/1995 | Hwu et al. | 455/327 |
| 7,359,694 B2 * | 4/2008 | Przybysz et al. | 455/323 |
| 8,548,415 B2 * | 10/2013 | Pesetski et al. | 455/323 |

\* cited by examiner

*Primary Examiner* — Quochien B Vuong

(74) *Attorney, Agent, or Firm* — Meyertons Hood Kivlin Kowert & Goetzel, P.C.; Jeffrey C. Hood

(57) ABSTRACT

In some embodiments, a system may include a passive uniplanar single-balanced millimeter-wave mixer. In some embodiments, a three-port diode-tee IC forming a mixer core is coupled between an end of a slotline balun and a second coplanar balun. The operational bandwidth of a mixer structure is enhanced by optimizing the distance between the mixer diode-tee core and the back-short circuits. The frequency separation of LO and IF signals may be accomplished by means of stand-alone three-port filter-diplexer device. The system may allow wider than a frequency octave operational bandwidth for a frequency converter device all the way into millimeter wave frequencies at the same time as supporting the operational bandwidth for baseband IF signal over more than six frequency octaves. In some embodiments, the system may accomplish a 500 MHz to 34.5 GHz continuous IF bandwidth with RF signal sweeping from 33 GHz to 67 GHz and local oscillator at 67.5 GHz fixed frequency.

21 Claims, 6 Drawing Sheets

ULTRA-BROADBAND PLANAR MILLIMETER-WAVE MIXER WITH MULTI-OCTAVE IF BANDWIDTH

FIELD OF THE INVENTION

This disclosure relates generally to mixers, and more particularly to implementing a mode conversion single-balanced planar mixer which allows to increase the IF bandwidth for millimeter wave mixer by eliminating the band limiting transitions in the transmission pass for the IF mixer product.

DESCRIPTION OF THE RELATED ART

A variety of Radio Frequency (RF) mixers have been developed for the purpose of frequency conversion of a baseband IF signal into RF frequency range by combining (mixing) the IF signal with a local oscillator (LO) signal or for a frequency conversion of the input RF signal into the baseband IF signal by mixing the input RF signal with a LO signal. There are a broad range of applications for mixer devices which include, but are not limited to, communication and data transceivers, a broad variety of radar systems, a broad range of test and measurements instruments like signal generators, spectrum analyzers (SA) and vector signal analyzers (VSA), vector network analyzers (VNA), oscilloscopes and many other test and measurement instruments. The frequency range of application for all of the above mentioned systems is rapidly expanding into higher and higher frequencies with the growth of the operational bandwidth requirements for a variety of applications. This results in greater demand for extreme broadband test and measurement instruments with the operational bandwidth covering a frequency range well into the tens or even hundreds of gigahertz. That is why there is a growing demand for extreme broadband frequency converting devices capable of converting a very broadband microwave input signal from a variety of devices under test (DUT) into a multi-octave baseband signal for the purpose of signal processing.

A broad variety of known mixer architectures is used for the purpose of broadband frequency converters. Double-balanced mixer architectures used for diodes connected in a diode ring or diode star connected to a balanced side of RF and LO distributed balun-transformers provide a transmission media to feed the RF and LO mixing signals into the mixer core. The baseband IF mixing product is transmitted from a balanced side of either RF or LO balun with the help of a low order low-pass filter structure. The known advantages of double-balanced mixers include the enhanced LO to RF isolation due to the fact that both of these signals are applied to virtual ground points of the opposite-side balun. Other known advantages of double-balanced mixers include the greater attenuation of LO noise at IF port and the attenuation of the mixing products with the even harmonics of LO signals. There are however the inherent limitations to the operational bandwidth for IF signal due to the fact that they require a separate transmission media for the IF signal in the form of a low order low-pass filter connected to a balanced side of either RF or LO balun. With the operational frequencies expanding into microwave and millimeter wave frequencies it becomes more and more difficult to de-couple the IF signal from the mixer core of a double-balanced mixer in a broadband manner due to the shrinking length of balun-transformers and due to the requirement to produce a separate broadband transmission media for the baseband signal.

Another class of broadband microwave and millimeter wave mixers is single-ended or single-balanced waveguide mixers. This class of microwave mixers covers RF bandwidth well into millimeter wave frequency range. The main limitation for this class of mixer devices is that the operational RF frequency range of the waveguide is limited to a frequency octave. Even with the tapered waveguide architectures this class will not cover much more than one octave of RF frequency bandwidth which limits the IF operational bandwidth as well. Another disadvantage of waveguide mixers is that they require a very precise machining of waveguide cavities which significantly increases the cost for this class of mixers.

A third class of very broadband mixers includes triple-balanced mixer structures. Triple-balanced mixers use two four-diode mixer rings connected in a way that all three ports of the mixer core are connected to separate balun-transformers which greatly improve the port-to-port isolation between RF, LO, and IF mixer ports and provides a greater operational bandwidth. The main disadvantages of triple-balanced mixer architectures include the requirement for more LO power to pump eight mixer diodes. Most of the triple-balanced mixer architectures structures are not planar which leads to much greater difficulty in assembling these mixers at high-end microwave and millimeter wave frequencies. Current microwave mixer designs, including even so-called planar mixer designs with the Schottky diodes fabricated on the same side of a support dielectric substrate as balun-transformers, exhibit significant limitations of operational bandwidth due to band-limiting planar transitions at any of the mixer ports (particularly for broadband frequency converter applications at frequencies above 50 GHz).

In view of these limitations and problems in the art of broadband microwave mixer design it would be desirable to provide a microwave mixer structure capable of covering more than a frequency octave of instantaneous bandwidth at microwave frequencies well above 50 GHz. It would be desirable if the microwave mixture structure accomplished the continuous baseband IF bandwidth over more than six frequency octaves with low conversion loss, unsurpassed conversion loss flatness over the entire IF band, and excellent unit to unit consistency in mixer performance.

SUMMARY

In view of limitations and problems in the art of broadband microwave mixer design herein is provided, in some embodiments, a microwave mixer structure capable of covering more than a frequency octave of instantaneous bandwidth at microwave frequencies well above 50 GHz at the same time as accomplishing the continuous baseband IF bandwidth over more than six frequency octaves with low conversion loss, unsurpassed conversion loss flatness over the entire IF band, and excellent unit to unit consistency in mixer performance. In some embodiments, one advantage of the broadband microwave mixer described herein may include elimination of band-limiting planar transitions between a LO+IF mixer port and a frequency multiplexer. The frequency multiplexer may provide a frequency separation between LO and IF signals by means of low-pass—band-pass diplexer structure and replacing it with a stand alone diplexer with extremely broadband coaxial interface between the mixer and mixer-diplexer. Another advantage of the broadband microwave mixer may include that the mixer conversion efficiency over a very broadband frequency range is greatly enhanced by optimizing the distance between the mixer diode core and the back-short circuit for the RF signal at LO+IF coplanar waveguide formed by conductive air bridge connecting the coplanar ground strips as well as the distance between the diode mixer core and back-short circuit across the slotline open.

The applications for the mixer apparatus described herein may not be limited by down-converter structures, but may include the up-converter structures where the multi-octave baseband signal is frequency translated to a microwave or a millimeter wave frequency range. As may be seen in FIG. 9-FIG. 10, a particular embodiment of the mixer apparatus may accomplish about 500 MHz to about 34.5 GHz continuous IF bandwidth with RF signal sweeping from about 33 GHz to about 67 GHz and Local Oscillator at about 67.5 GHz fixed frequency. As demonstrated by, for example, FIG. 10, the instantaneous bandwidth of the mixer apparatus demonstrated in some embodiments may be limited only by particular system requirements for the cut-off frequency for a mixer-diplexer low-pass filter and may be significantly increased in some embodiments. An advantage of the mixer apparatus generally described herein may include a capability of supporting the RF frequency range well above abut 70 GHz with the instantaneous bandwidth greater than a waveguide band which is a typical RF bandwidth for microwave and millimeter wave mixer structures offered currently.

BRIEF DESCRIPTION OF THE DRAWINGS

The following detailed description makes reference to the accompanying drawings, which are now briefly described.

Figure 1:
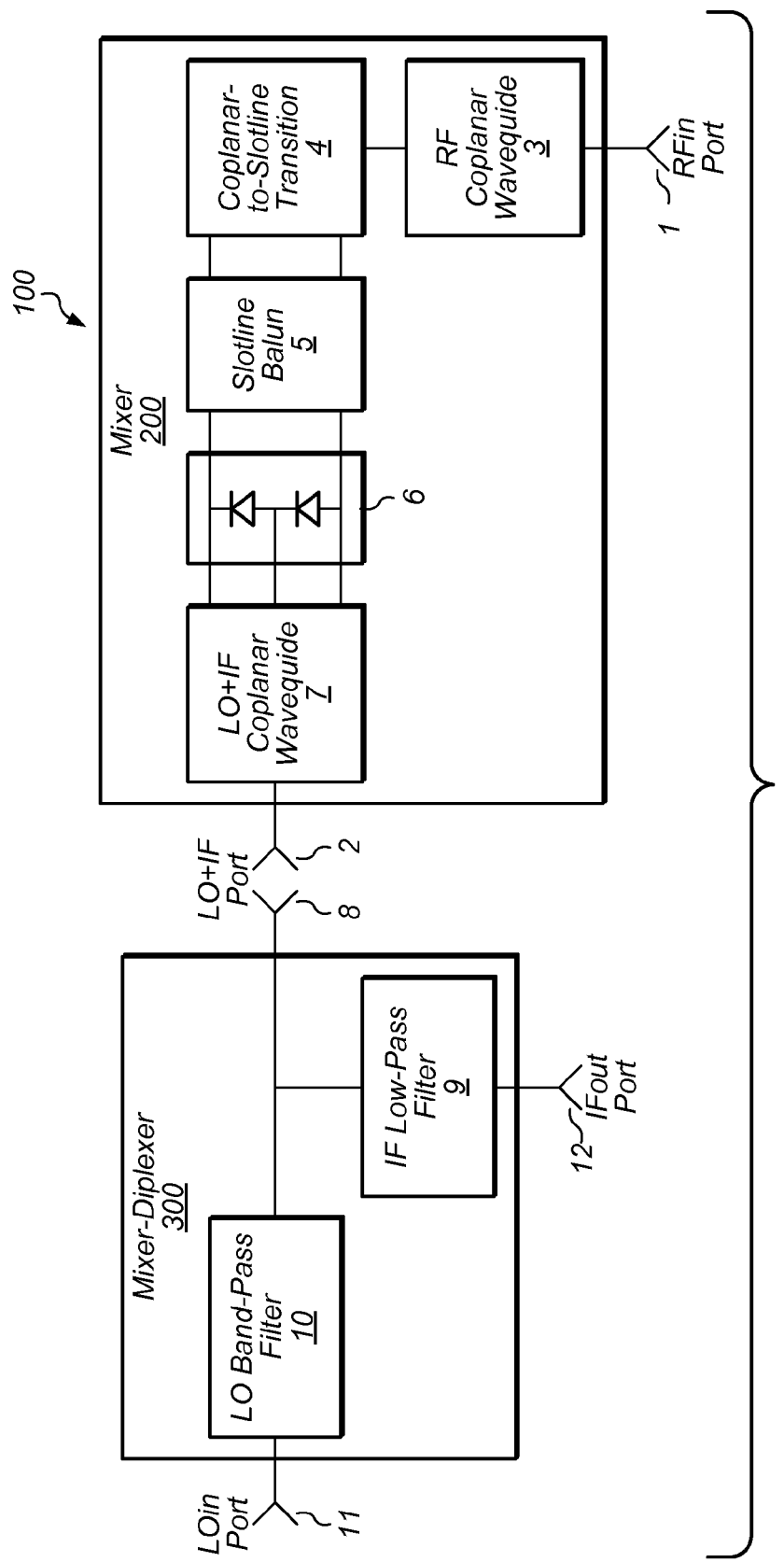
FIG. 1 depicts a block-diagram of an embodiment of a mixer with a stand-alone mixer-diplexer.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

The headings used herein are for organizational purposes only and are not meant to be used to limit the scope of the description. As used throughout this application, the word "may" is used in a permissive sense (i.e., meaning having the potential to), rather than the mandatory sense (i.e., meaning must). The words "include," "including," and "includes" indicate open-ended relationships and therefore mean including, but not limited to. Similarly, the words "have," "having," and "has" also indicated open-ended relationships, and thus mean having, but not limited to. The terms "first," "second," "third," and so forth as used herein are used as labels for nouns that they precede, and do not imply any type of ordering (e.g., spatial, temporal, logical, etc.) unless such an ordering is otherwise explicitly indicated. For example, a "third component electrically connected to the module substrate" does not preclude scenarios in which a "fourth component electrically connected to the module substrate" is connected prior to the third component, unless otherwise specified. Similarly, a "second" feature does not require that a "first" feature be implemented prior to the "second" feature, unless otherwise specified.

Various components may be described as "configured to" perform a task or tasks. In such contexts, "configured to" is a broad recitation generally meaning "having structure that" performs the task or tasks during operation. As such, the component can be configured to perform the task even when the component is not currently performing that task (e.g., a set of electrical conductors may be configured to electrically connect a module to another module, even when the two modules are not connected). In some contexts, "configured to" may be a broad recitation of structure generally meaning "having circuitry that" performs the task or tasks during operation. As such, the component can be configured to perform the task even when the component is not currently on. In general, the circuitry that forms the structure corresponding to "configured to" may include hardware circuits.

Various components may be described as performing a task or tasks, for convenience in the description. Such descriptions should be interpreted as including the phrase "configured to." Reciting a component that is configured to perform one or more tasks is expressly intended not to invoke 35 U.S.C. §112, paragraph six, interpretation for that component.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

DETAILED DESCRIPTION OF THE EMBODIMENTS

FIG. 1 depicts a block diagram depicting an embodiment of a system 100 including a planar mixer 200 with stand-alone mixer-diplexer 300. The mixer module may include a first port 1 and a second port 2. The first port may include a coaxial RF port. The second port may include a coaxial LO+IF port. The first port 1 may couple to RF coplanar waveguide 3 which may convey an RF signal to broadband coplanar-to-slotline transition 4 (e.g., of an open/short type). The RF signal may be conveyed in such a manner that one side 32 of coplanar waveguide 3 is terminated in slotline open 34 reflecting the RF signal. The RF signal may be conveyed such that the other side 33 of coplanar waveguide 3 is transformed into a slotline balun 5 with the signal conductor 14 of coplanar waveguide 3 feeding one of the metal strips 15 of slotline balun and the ground plane metal strips 16-17 of coplanar waveguide feeding the opposite polarity metal strip 18 of slotline balun 5.

The output of slotline balun 5 feeds the RF signal to RF port of a mixer core 6. The mixer core may include a diode-tee IC. The diode-tee IC may be formed such that an anode of the first diode D1 of the diode-tee IC may be coupled to one of the metal strips 18 of slotline balun 5. A cathode of the second diode D2 of a diode-tee may be coupled to the opposite polarity metal strip 15 of slotline balun 5.

In some embodiments, a LO+IF coaxial port of mixer module 2 may be coupled to LO+IF coplanar waveguide 7. LO+IF coplanar waveguide 7 may provide the transmission media for mixer LO signal and for (LO-RF) IF mixer product. An output port of (LO+IF) coplanar waveguide 7 may be coupled to (LO+IF) port of the mixer core 6. They may be coupled such that signal conductor 21 of coplanar waveguide 7 is coupled to a common port of a diode-tee. The common port of the diode-tee may be located between the cathode of the first diode D1 of the diode-tee and the anode of the second diode D2 of the diode-tee. The anode of the first diode and cathode of the second diode of the diode-tee may be coupled to coplanar ground metal strips (22) and (23) of (LO+IF) coplanar waveguide 7.

In contrast with the planar mixer designs of the prior art the coaxial interface between (LO+IF) second port 2 of the mixer module and the (LO+IF) third port 8 of stand-alone mixer-diplexer is implemented for a purpose of achieving superior conversion loss flatness over multi-octave IF bandwidth. (LO+IF) third port 8 of mixer-diplexer may be coupled to a (LO+IF) transmission line inside of three port stand alone mixer-diplexer module 300 of a band-pass/low-pass type. Mixer-diplexer module 300 may provide a frequency separation between LO and IF signals. Different types of transmission media may be utilized to implement the low-pass and the band-pass filters in the mixer-diplexer. In some embodiments, the system utilizes a diplexer structure with a suspended stripline to implement the 9-th order Tchebysheff low-pass IF filter 9 and the 7-th order Tchebysheff band-pass LO filter 10. The coaxial LO fifth port 11 of the mixer-diplexer may be coupled to the LO port of mixer-diplexer band-pass filter 10. The other end of LO band-pass filter may be coupled to the LO+IF transmission line of the mixer-diplexer. The fourth port 12 (e.g., a coaxial IF port) of the mixer-diplexer may be coupled to IT port of mixer-diplexer low-pass filter 9. The other end of the IF low-pass filter may be coupled to the LO+IF transmission line. The selection of the transmission media for mixer-diplexer of low-pass—band-pass filter structure in some embodiments was done to achieve the low in-band insertion loss and high out of band rejection for the low-pass and band-pass filters.

Figure 2:
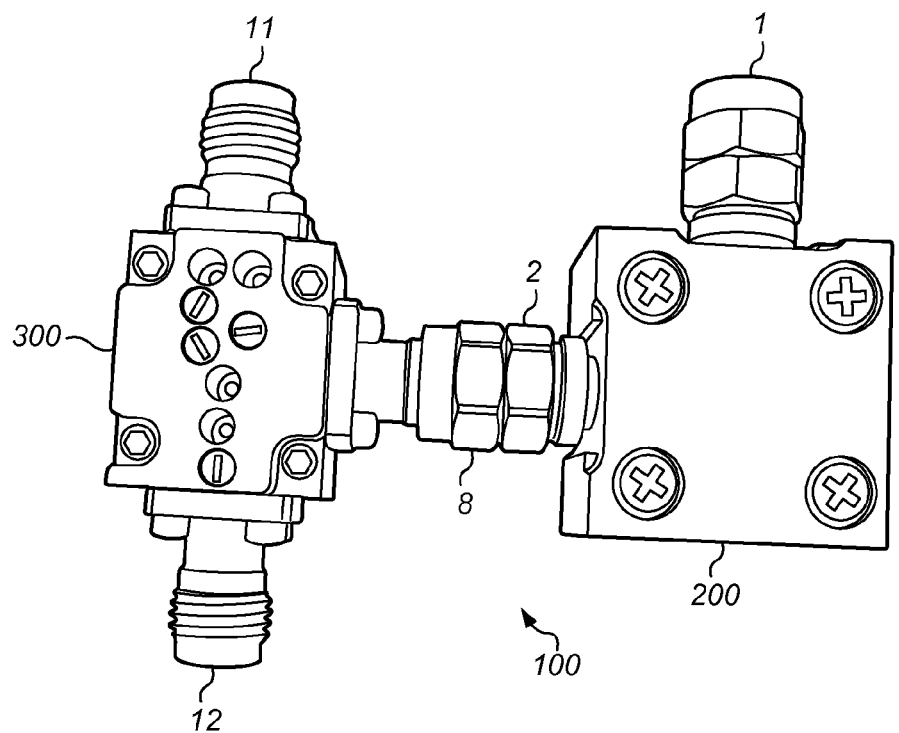
FIG. 2 depicts an embodiment of a mixer with a stand-alone mixer-diplexer.
Figure 3:
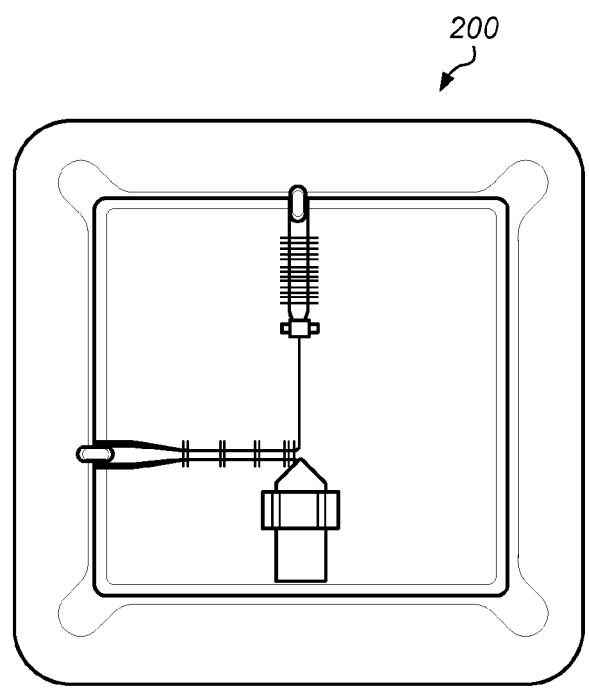
FIG. 3 depicts an embodiment of a particular mixer assembly without an upper cover.

FIG. 2 depicts an embodiment of system 100 including a particular mixer 200 and mixer-diplexer 300 assembly which was tested with N5227 PNA calibrated for Scalar Mixer Measurements and external source for LO signal with Flo=67.5 GHz, Plo=+18 dBm FIG. 3 depicts particular mixer module 200 with open top cover which was assembled and tested to demonstrate the capabilities of an embodiment of the system.

Figure 4:
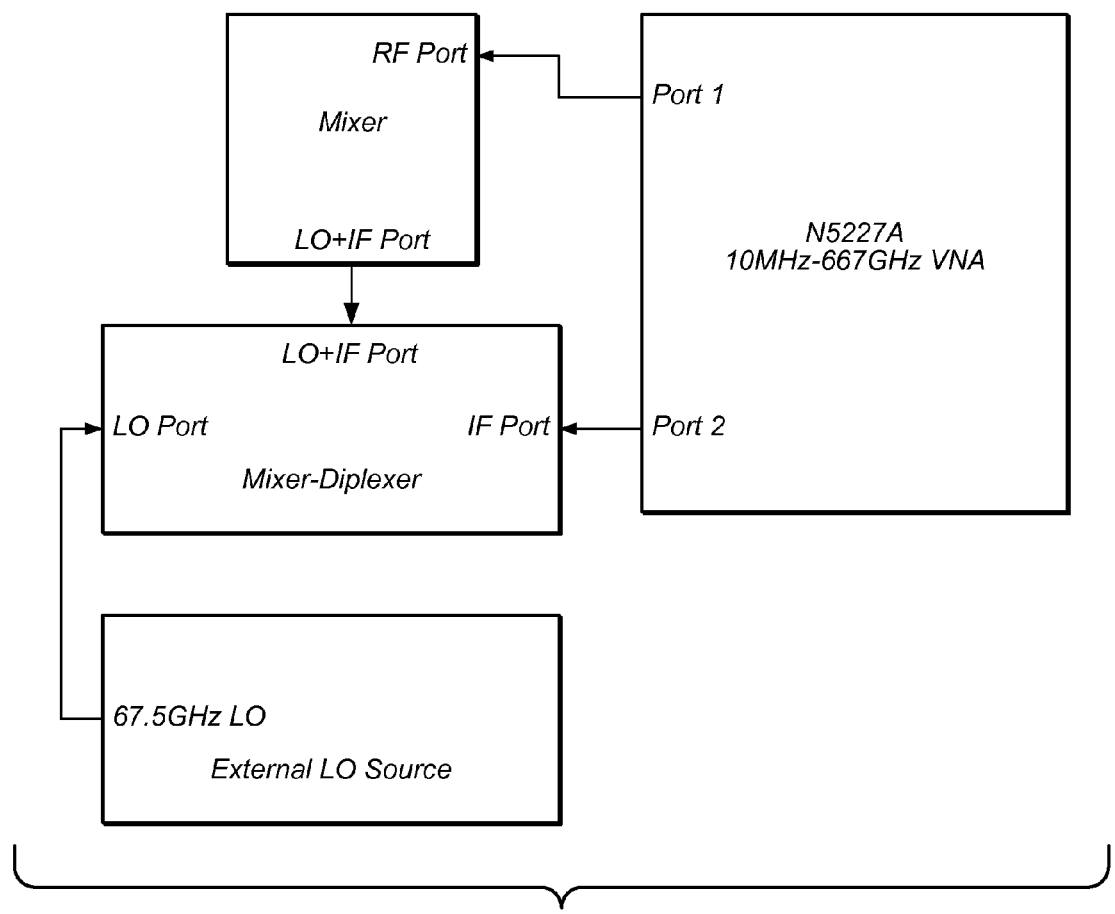
FIG. 4 depicts a block-diagram of an embodiment of conversion loss measurement test bench for the mixer and mixer-diplexer assembly.

FIG. 4 depicts the conversion loss test bench setup with N5227A PNA Vector Network Analyzer calibrated for Scalar Mixer measurements with the port power calibrated with +/−0.1 dB over RF and IF frequency range, external frequency source providing the mixer LO at 67.5 GHz with +18.4 dBm into LO port of mixer-diplexer and a mixer with mixer-diplexer assembly made according to an embodiment of the system described herein.

Figure 5:
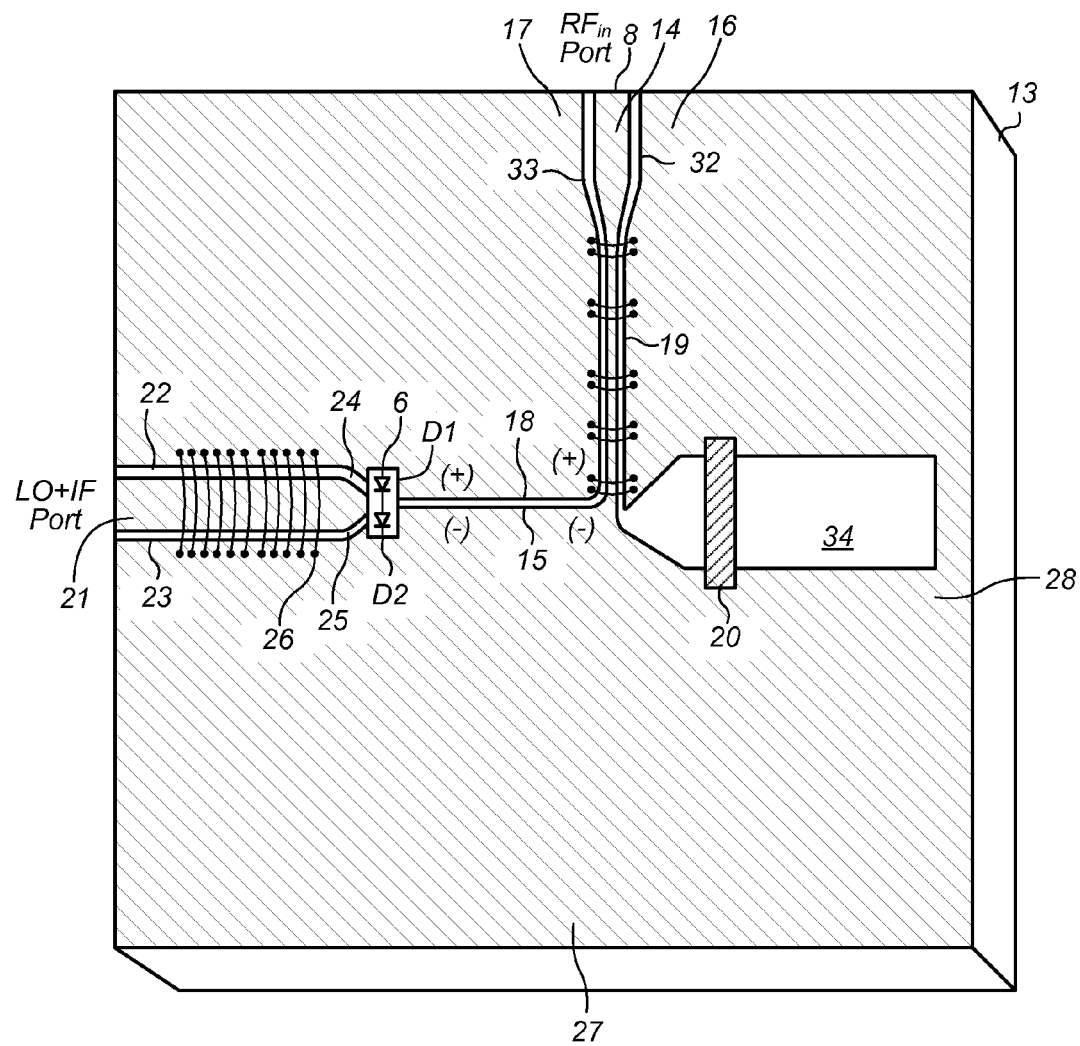
FIG. 5 depicts a perspective view of an embodiment of a mixer substrate assembly as constructed.

FIG. 5 illustrates a perspective view of mixer substrate assembly as constructed according to a particular embodiment. The diminutions of mixer substrate 13 may be determined by the requirements to accommodate the frequency range for a particular application. The dielectric material of mixer substrate 13 in an embodiment is 99.6% alumina, but a broad variety of dielectric materials may be selected by individuals skilled in the art.

In a particular embodiment, the planar mixer substrate 13 may be supported by four metallic ledges in the lower hollow compartment of the mixer housing. The RF coplanar waveguide feed 8 may terminate on the edge of mixer substrate 13. RF coplanar waveguide 3 may be used to transmit the RF signal from first port 1 to coplanar-to-slotline transition of open-short type 4. The RF signal may be transmitted in such a manner that one side of coplanar waveguide 3 may be terminated in slotline open 34 reflecting the RF signal. The other side of coplanar waveguide 3 may be transformed into a slotline balun 5 with the signal conductor 14 of coplanar waveguide 3 feeding one of metal strips 15 of slotline balun 5. The ground plane metal strips 16 and 17 of RF coplanar waveguide 3 may feed the opposite polarity metal strip 18 of slotline balun 5. In some embodiments, conductive air bridges 19 may equalize the instantaneous potential of an electric field of RF signals along coplanar ground strips 16-17 of coplanar waveguide 3 and may establish the same instantaneous potential of an electric field of RF signals at one side of slotline open 34.

A broad variety of slotline open shapes may be available for those skilled with the art of planar mixer design. It may include, but is not limited to, a circular shape, an oval shape, a radial stub shape, and an elliptic shape. The size and shape of the slotline open may be optimized for a particular frequency range of application and bandwidth requirements. The output of slotline balun 5 may feed the RF signal to RF port of mixer core 6 which includes a diode-tee IC. The anode of first diode D1 of the diode-tee may be coupled to metal strip 18 of slotline balun 5. The cathode of second diode D2 of the diode-tee may be coupled to metal strip 15 of slotline balun 5 which carries the opposite instantaneous polarity of the RF signal.

Second port 2 of the mixer module may be coupled to the input port of (LO+IF) coplanar waveguide 7. The output port of (LO+IF) coplanar waveguide 7 may be coupled to the (LO+IF) port of mixer core 6. Signal conductor 21 of coplanar waveguide 7 may be coupled to a common port of a diode-tee located between the cathode of diode D1 and to the anode of diode D2. The anode of D1 diode may be coupled to ground conductor 22 of coplanar waveguide 7. The cathode of diode D2 may be coupled to second ground conductor 23 of coplanar waveguide 7.

In some embodiments, the physical dimensions of the LO+IF coplanar waveguide, namely the width of a signal conductor 21 and coplanar gaps 24-25 between signal conductor 21 and ground conductors 22-23, may be optimized to accommodate the physical size of the mixer core diode-tee and to terminate RF slotline balun 5 into the high impedance at the transition between slotline balun 5 and coplanar waveguide 7. The LO to RF isolation in an embodiment may be enhanced by applying the LO signal to a virtual ground point of the RF slotline balun and by optimizing the transition between RF slotline balun 5 and LO+IF coplanar waveguide 7. LO+IF coplanar waveguide 7 may present a high impedance to slotline balun 5 by tapering out coplanar gaps 24-25 from the RF port of mixer core 6 into the coplanar waveguide and by optimizing the distance between the RF port of mixer core 6 and conductive air bridge 26 which constitutes the back-short for the RF signal reflecting it back to the mixer core.

As demonstrated in FIG. 5 and FIG. 8, the distance to conductive air bridge 20 across slotline open 34 may be optimized to reflect the RF signal from coplanar-to-slotline transition 4 back to the mixer core which may improve the mixer conversion loss flatness over the extremely wide IF bandwidth. The ground continuity between the ground plane return on planar mixer substrate 13 and the mixer housing may be enhanced by making a continuous conductive bridge electrically coupling ground plane conductors 16-17, 22-23, and 27-28 with the side walls of the mixer housing by means of a conductive material (e.g., epoxy or solder).

Figure 6:
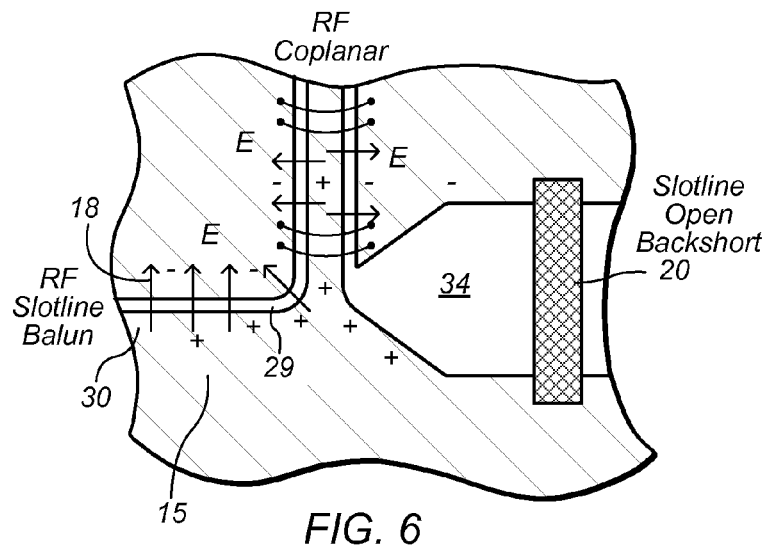
FIG. 6 depicts an embodiment of a RF coplanar waveguide with coplanar-to-slotline transition of open-short type and instantaneous orientation of electric field for coplanar waveguide and for slotline balun and the slotline back-short gold ribbon across the slotline open.

FIG. 6 depicts the instantaneous polarity of electric field 30 along RF coplanar waveguide 3, slotline balun 5 and slotline-to-coplanar transition 4. As it depicted in FIG. 6, the RF signal may be reflected from the slotline open and slotline open back short 20 and excite the slotline balun with the RF electric field propagating along slotline balun 5 with the opposite instantaneous polarity of the RF electric field along the metal strips 15 and 18.

Figure 7:
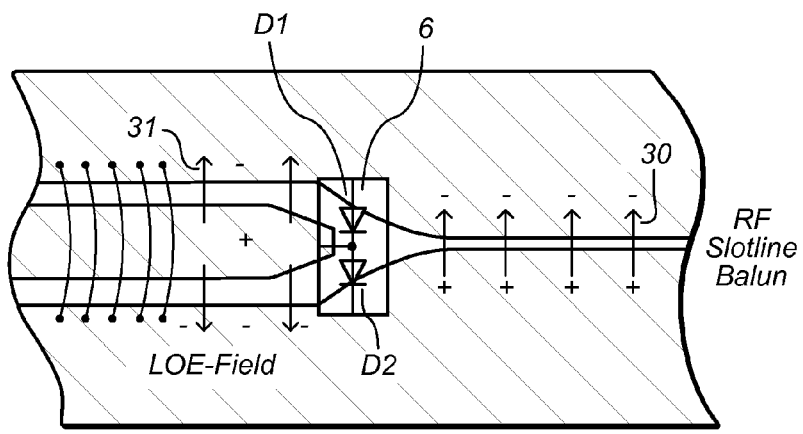
FIG. 7 depicts an embodiment of a single-balanced mixer assembly detail with the diode-tee assembled across the transition between the slotline RF balun and coplanar LO+IF waveguide.

FIG. 7 depicts an embodiment of the assembly detail of the planar mixer substrate with the mixer core 6. FIG. 7 depicts an example of particular set of instantaneous orientations of RF electric field 30 along RF slotline balun 5. FIG. 7 depicts an example of particular set of instantaneous orientations of the electric field of LO signal 31 along the LO+IF coplanar waveguide. In this particular embodiment the LO signal turns "ON" diode D2 of mixer core 6 which produces (n*LO)±(m*RF) mixer products and turns "OFF" diode D1 of the mixer core. When the instantaneous orientation of LO signal electric field changes the instantaneous polarity LO signal may turn "ON" diode D1 of the mixer core which produces (n*LO)±(m*RF) mixer products and may turn "OFF" diode D2 of the mixer core. The (n*LO)±(m*RF) mixer products may propagate along (LO+IF) coplanar waveguide 7 towards a very broadband coaxial transition between the mixer and mixer-diplexer modules.

Figures 8A, 8B:
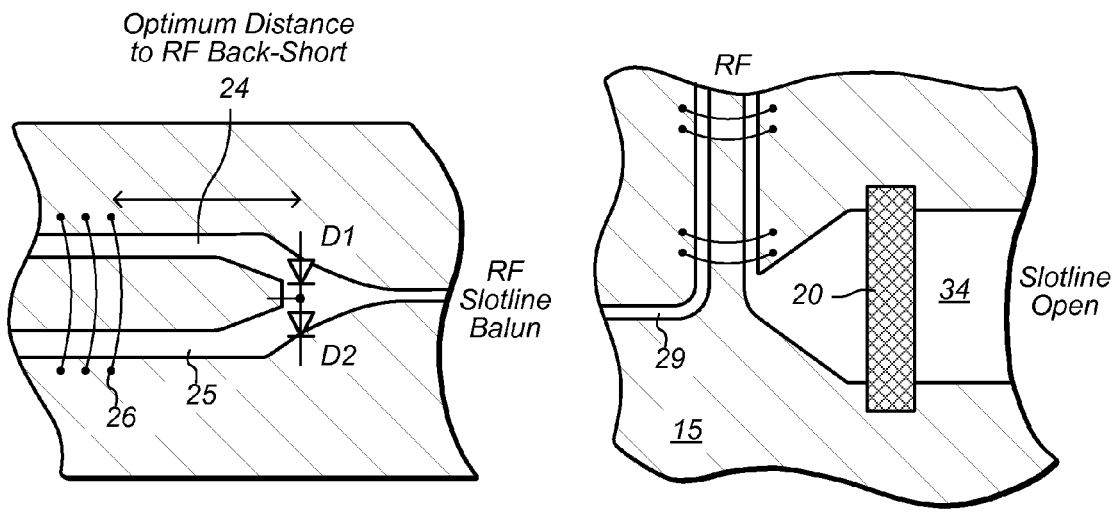
FIG. 8A and FIG. 8B depict an embodiment of a concept of optimizing the critical distance to RF back-short across the LO+IF coplanar waveguide and across the slotline open in coplanar-to-slotline transition. The particular implementation of back-short conductive bridges is not limited to gold wire or gold ribbon.

FIG. 8A and FIG. 8B depict an embodiment of back-short conductive bridges 26 and 20. The distance between mixer core 6 and last conductive air bridge 26 across (LO+IF) coplanar waveguide 7 and between mixer core 6 and the back-short across slotline open 34 may be optimized to achieve the best conversion loss flatness across the entire bandwidth of interest.

Figure 9:
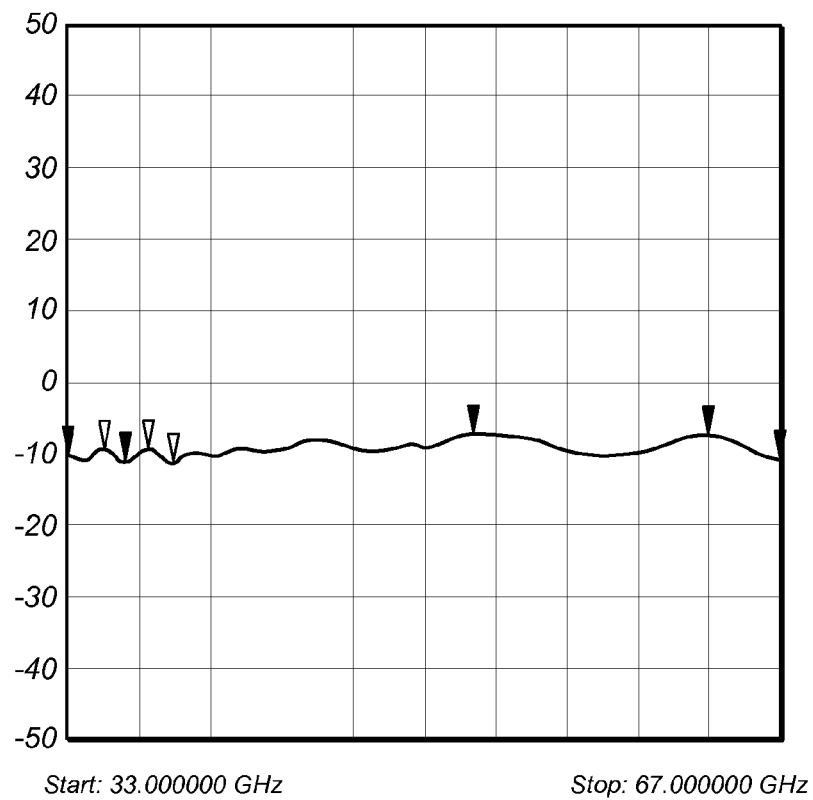
FIG. 9 depicts an embodiment of a mixer conversion loss measurement results for a particular mixer and mixer-diplexer assembly.

FIG. 9 and Table I depict the conversion loss measurement results for a particular embodiment of a mixer and mixer-diplexer modules assembled. The conversion loss measurements were performed with the Agilent N5227A Vector Network Analyzer calibrated for Scalar Mixer Conversion Loss measurements, Agilent Signal Generator providing the RF signal at 33 GHZ to 67 GHz RF frequency with −12 dBm power of RF signal and Local Oscillator signal source with LO frequency at 67.7 GHz with LO signal power of 18.4 dBm developed at Phase Matrix, the National Instruments Company. The conversion loss measurement results are normalized to the applied RF input signal. The frequency range of (LO-RF) baseband IF mixer product is 500 MHz to 34.5 GHz. As it demonstrated in FIG. 9, the conversion loss for mixer and mixer-diplexer under test varies between −7 dB and −11.17 dB over the entire IF bandwidth.

TABLE I

| Mkr | Trace | X-Axis | Value | Notes |
|---|---|---|---|---|
| 1 V | S21 | 33.000000 GHz | −10.1990 dB | U117 Flo = 67.5 GHz Plo = 16 dBm Frf = 33 GHz to 67 GHz Prf = −12 dBm Fif = 500 MHz to 34.5 GHz |
| 2 V | S21 | 52.295000 GHz | −7.1004 dB | |
| 3 V | S21 | 63.472500 GHz | −7.3206 dB | |
| 4 V | S21 | 67.000000 GHz | −10.7115 dB | |
| 5 V | S21 | 35.698750 GHz | −11.1667 dB | |
| 6 V | S21 | 34.742500 GHz | −9.2829 dB | |
| 7V | S21 | 36.803750 GHz | −9.3300 dB | |
| 8 V | S21 | 37.993750 GHz | −11.1142 dB | |

Figure 10:
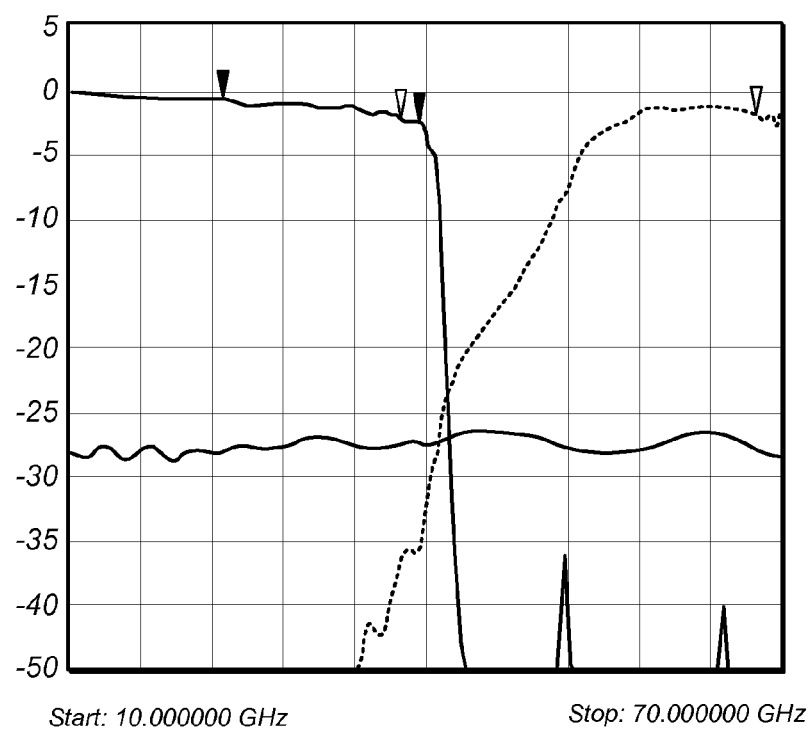
FIG. 10 depicts an embodiment of measurement results for a mixer-diplexer unit which was used in the mixer—mixer-diplexer assembly illustrated in FIG. 2 and FIG. 6.

FIG. 10 and Table II depict the frequency response for the mixer-diplexer module used in mixer conversion loss measurements demonstrated in FIG. 9. As is demonstrated in FIG. 10, the RF and IF bandwidth for the mixer and mixer-diplexer modules assembled was limited by the cut-off frequency of the low-pass filter in the mixer-diplexer module under test. The bandwidth requirements for the mixer-diplexer low-pass filter may be set up according to customer requirements.

TABLE II

| Mkr | Trace | X-Axis | Value | Notes |
|---|---|---|---|---|
| 1V | S21 | 15.057850 GHz | −0.7518 dB | MD U116 LPF (IF_out Port) |
| 2V | S21 | 34.305100 GHz | −2.3018 dB | MD U116 LPF (IF_out Port) |
| 3V | S21 | 32.555350 GHz | −2.1636 dB | MD U116 LPF (IF_out Port) |
| 4V | S31 | 67.550350 GHz | −1.9977 dB | MD U116 Band-Pass Filter (LO_in Port) |

Although the embodiments above have been described in considerable detail, numerous variations and modifications will become apparent to those skilled in the art once the above disclosure is fully appreciated. It is intended that the following claims be interpreted to embrace all such variations and modifications.

The invention claimed is:

1. A system comprising a passive uniplanar single-balanced millimeter-wave mixer comprising:
   a metallic mixer housing comprising a first compartment and a second compartment,
   a dielectric substrate positioned in the first compartment configured to support a first coplanar waveguide, a coplanar-to-slotline transition, a slotline balun, and a second coplanar waveguide electrically connected to feed RF, LO, and IF electrical signals to and from a single-balanced mixer core structure;
   wherein the first coplanar waveguide is coupled to a first port at a first end and is configured to convey the RF signal to the coplanar-to-slotline transition which is electrically coupled to a second end of the first coplanar waveguide;
   wherein the coplanar-to-slotline transition is configured to convert the RF signal from an unbalanced common mode into a balanced slotline mode by terminating a first slot of the first coplanar waveguide into a slotline open termination which electrically separates a first and a second metal conductor of opposite electrical polarity forming the slotline balun, wherein a second slot of the first coplanar waveguide terminates into the slotline balun;

wherein the first metal conductor of the slotline balun is electrically coupled to a second ground strip metal conductor of the first coplanar waveguide, and wherein the second metal conductor of the slotline balun is electrically coupled to a signal conductor of the first coplanar waveguide;

wherein the second coplanar waveguide is coupled to a second port, wherein the second port comprises a broadband coaxial interface;

wherein the single-balanced mixer core structure comprises a three-port diode-tee;

wherein the distance between the single-balanced mixer core structure and a back-short circuit for RF signal is optimized such that a mixer conversion efficiency over a very wide operational bandwidth is improved.

2. The system of claim 1, wherein the coplanar-to-slotline transition comprises an open-short type coplanar-to-slotline transition.

3. The system of claim 1, wherein the first port comprises a coaxial port.

4. The system of claim 1, wherein the first slot of the first coplanar waveguide is formed by a signal conductor of the first coplanar waveguide and a first ground strip metal conductor of the first coplanar waveguide.

5. The system of claim 1, wherein the second slot of the first coplanar waveguide is formed by a signal conductor of the first coplanar waveguide and a second ground strip metal conductor of the first coplanar waveguide.

6. The system of claim 1, further comprising an electrical short circuit configured to substantially equalize an electrical potential of a first ground strip metal conductor and a second ground strip metal conductor at the second end of the first coplanar waveguide.

7. The system of claim 1, wherein the second end of the slotline balun is electrically terminated into the first port of a single-balanced mixer core, and wherein the impedance match at a first end and at a second end of the slotline balun is accomplished by tapering a width of a slot between the first and the second metal conductors constituting the slotline balun.

8. The system of claim 1, wherein the second coplanar waveguide conveys a local oscillator electrical signal to a LO port of the single-balanced mixer core structure and provides a transmission media for an IF mixer product at (LO-RF) frequency range.

9. The system of claim 1, wherein the three-port diode-tee comprises a first diode and a second diode, wherein an anode of the first diode is electrically coupled to the first metal conductor of the slotline balun, a cathode of the first diode is coupled to an anode of the second diode and to the signal conductor of the second coplanar waveguide, and wherein the cathode of the second diode is coupled to the second metal conductor of the slotline balun.

10. The system of claim 1, wherein the back-short circuit comprises a metallic air bridge.

11. The system of claim 1, wherein the back-short circuit comprises a metallic air bridge, wherein the metallic air bridge comprises gold wire or gold ribbon connecting the ground planes of the LO+IF coplanar waveguide and the back-short circuit across the slotline open.

12. The system of claim 1, wherein the system is configured to provide at least 500 MHz to 34.5 GHz continuous IF bandwidth with RF signal sweeping from 33 GHz to 67 GHz and Local Oscillator at 67.5 GHz fixed frequency.

13. The system of claim 1, wherein the system is configured to support the RF frequency range well above 70 GHz.

14. The system of claim 1, further comprising a mixer diplexer comprising:
a distributed low-pass filter electrically coupled to a third port and electrically coupled to a fourth port, wherein the third port is couplable to the second port and comprises a broadband coaxial interface; and
a distributed band-pass LO filter electrically coupled to a fifth port and electrically coupled to the third port.

15. The system of claim 14, further comprising a metallic housing, wherein the third, fourth, and fifth ports provide mechanical support for a mixer-diplexer substrate and optimized waveguide channels for the distributed low-pass and distributed band-pass LO filters positioned on the mixer-diplexer substrate.

16. The system of claim 14, wherein the fourth port comprises a coaxial baseband IF port.

17. The system of claim 14, wherein the fifth port comprises a coaxial LO port.

18. The system of claim 14, wherein the third port comprises a (LO+IF) port.

19. The system of claim 14, wherein the mixer diplexer is configured to provide a frequency separation between LO and IF electrical signals at the fourth and fifth ports.

20. The system of claim 19, wherein the mixer diplexer is configured to provide a broadband transmission media for both LO and IF electrical signals at the third port.

21. The system of claim 20, wherein the mixer diplexer is configured to transmit a local oscillator signal from the fifth port to the third port while providing a transmission media for a mixer product at (LO-RF) baseband frequency from the third port to the fourth port inhibiting band limiting planar transitions in the transmission pass for the baseband IF frequency signal while achieving better then 35 dB isolation between LO and IF electrical signals.

* * * * *